(12) United States Patent
Ranjan et al.

(10) Patent No.: US 9,990,245 B2
(45) Date of Patent: Jun. 5, 2018

(54) ELECTRONIC DEVICE HAVING FAULT MONITORING FOR A MEMORY AND ASSOCIATED METHODS

(71) Applicants: STMICROELECTRONICS INTERNATIONAL N.V., Amsterdam (NL); STMICROELECTRONICS S.R.L., Agrate Brianza (IT)

(72) Inventors: Om Ranjan, New Delhi (IN); Fabio Enrico Carlo Disegni, Spino d'adda (IT)

(73) Assignees: STMicroelectronics S.r.l., Agrate Brianza (MB) (IT); STMicroelectronics International N.V., Amsterdam (NL)

( * ) Notice: Subject to any disclaimer, the term of this patent is extended or adjusted under 35 U.S.C. 154(b) by 114 days.

(21) Appl. No.: 14/951,639

(22) Filed: Nov. 25, 2015

(65) Prior Publication Data

US 2017/0147416 A1 May 25, 2017

(51) Int. Cl.
| | |
|---|---|
| G06F 11/00 | (2006.01) |
| G06F 11/07 | (2006.01) |
| G06F 11/08 | (2006.01) |
| G06F 11/16 | (2006.01) |
| G11C 29/42 | (2006.01) |
| G11C 29/02 | (2006.01) |

(Continued)

(52) U.S. Cl.
CPC .......... G06F 11/079 (2013.01); G06F 11/073 (2013.01); G06F 11/076 (2013.01); G06F 11/0751 (2013.01); G06F 11/0772 (2013.01); G06F 11/08 (2013.01); G06F 11/16 (2013.01); G06F 11/1004 (2013.01); G11B 2020/1843 (2013.01); G11C 29/02 (2013.01); G11C 29/04 (2013.01); G11C 29/42 (2013.01)

(58) Field of Classification Search
CPC .. G06F 11/079; G06F 11/073; G06F 11/0751; G06F 11/0772; G06F 11/076; G06F 11/1004; G11C 29/42; G11C 29/02; G11C 29/04; G11B 2020/1843
USPC ........ 714/718, 763, 764, 765, 766, 704, 819
See application file for complete search history.

(56) References Cited

U.S. PATENT DOCUMENTS

| | | | | |
|---|---|---|---|---|
| 4,535,455 | A | * | 8/1985 | Peterson ............... G06F 11/073 |
| | | | | 714/48 |
| 4,875,209 | A | * | 10/1989 | Mathewes, Jr. ........................... |
| | | | | G01R 31/318566 |
| | | | | 714/703 |
| 5,031,180 | A | | 7/1991 | McIver et al. |
| 5,905,858 | A | | 5/1999 | Jeddeloh |
| 5,933,436 | A | * | 8/1999 | Tanzawa ............. H03M 13/151 |
| | | | | 365/200 |

(Continued)

Primary Examiner — Albert Decady
Assistant Examiner — Osman M Alshack
(74) Attorney, Agent, or Firm — Slater Matsil, LLP

(57) ABSTRACT

An electronic device includes a memory having memory locations being subject to transient faults and permanent faults, and a fault detection circuit coupled to the memory. The fault detection circuit is configured to read the memory locations at a first time, and determine a first fault count and fault map signature including the transient and permanent faults at the first time based upon reading the plurality of memory locations, and to store the first fault count and fault map signature. The fault detection circuit is configured to read the memory locations at a second time and determine a second fault count and fault map signature including the transient and permanent faults at the second time based upon reading the memory locations, and compare the stored first fault count and fault map signature with the second fault count and fault map signature to determine a permanent fault count.

20 Claims, 2 Drawing Sheets

(51) Int. Cl.
*G11B 20/18* (2006.01)
*G06F 11/10* (2006.01)
*G11C 29/04* (2006.01)

(56) References Cited

U.S. PATENT DOCUMENTS

| | | | |
|---|---|---|---|
| 6,119,248 A | 9/2000 | Merkin | |
| 6,363,502 B1 | 3/2002 | Jeddeloh | |
| 7,420,791 B1 | 9/2008 | Dong et al. | |
| 8,001,446 B2 | 8/2011 | Walma | |
| 2003/0226074 A1* | 12/2003 | Ohlhoff | G11C 29/56 714/718 |
| 2006/0190700 A1* | 8/2006 | Altman | G06F 11/1641 712/7 |
| 2007/0079184 A1* | 4/2007 | Weiss | G06F 11/1064 714/718 |
| 2009/0217090 A1* | 8/2009 | Weiberle | G06F 11/1438 714/16 |
| 2010/0127680 A1* | 5/2010 | Satterfield | H02M 3/156 323/282 |
| 2011/0047408 A1* | 2/2011 | Gille | G06F 11/141 714/723 |
| 2013/0103991 A1* | 4/2013 | Evain | G06F 11/1012 714/701 |
| 2013/0191701 A1* | 7/2013 | Mueller | G06F 11/1048 714/764 |
| 2014/0269109 A1* | 9/2014 | Kong | G11C 29/04 365/189.07 |
| 2015/0309872 A1* | 10/2015 | Cai | G06F 11/1024 714/764 |

* cited by examiner

ELECTRONIC DEVICE HAVING FAULT MONITORING FOR A MEMORY AND ASSOCIATED METHODS

FIELD

The present invention relates to the field of memories, and, more particularly, to efficient fault monitoring in memories and related methods.

BACKGROUND

Applications can tolerate memory faults to a certain extent before being disrupted abruptly. Permanent and transient faults may occur during an execution of an application. A permanent fault is typically defined as a fault that is persistent and does not disappear when the application is powered off. Permanent faults are typically caused by physical defects of the memory. A transient fault is a fault that occurs during execution of the application and disappears when the application is powered off. Transient faults are typically caused by changes of data values without a physical defect of the memory, and may occur as a result of environmental conditions.

Typically, transient faults occur much more frequently than permanent faults and are a result of the memory developing the faults over a period of usage. In the presence of error correction mechanisms, the applications may need to know the extent of such faults to assess the severity of the physical defects of the memory. One application may be for a memory used in an automobile, for example.

SUMMARY

An electronic device may include a memory having a plurality of memory locations being subject to transient faults and permanent faults, and a fault detection circuit coupled to the memory. The fault detection circuit may be configured to read the plurality of memory locations at a first time, and determine a first fault count and fault map signature including the transient and permanent faults at the first time, based upon reading the plurality of memory locations, and store the first fault count and fault map signature. The fault detection circuit may also read the plurality of memory locations at a second time, and determine a second fault count and fault map signature including the transient and permanent faults at the second time, based upon reading the plurality of memory locations, and compare the stored first fault count and fault map signature with the second fault count and fault map signature to determine a permanent fault count. Accordingly, the fault detection circuit may detect the extent of faults in a memory, such as before the faults reach a threshold point where an application is disrupted abruptly.

The fault detection circuit may also include an indicator circuit to generate an indication based upon the permanent fault count exceeding a threshold. In addition, the fault detection circuit may include a memory controller configured to read the plurality of memory locations, and a memory error handler coupled to the memory controller. The memory controller may include a cyclic redundancy check (CRC) circuit configured to detect the transient and permanent faults, and an error counter coupled to the CRC circuit and configured to determine the first and second counts of the transient and permanent faults.

The fault detection circuit may further include a processor coupled to the CRC circuit and an error counter to compare the stored first fault count and fault map signature with the second fault count to determine the permanent fault count based upon a change between the stored first fault count and fault map signature, and the second fault count and fault map signature. The memory controller may be configured to store the first fault count and fault map signature and the permanent fault count in triple replication over different blocks within the memory and the CRC circuit may be configured to compute a fault map signature from each transient and permanent fault.

The first time at which to determine a fault count and fault map signature may correspond to a power-down event of the memory and the second time may be a power-up event of the memory, where each transient and permanent fault may have a memory address and a syndrome associated therewith. In addition, each transient fault may be a single bit or double bit correctable error, and each permanent fault may be a triple bit uncorrectable error. The memory may be a non-volatile memory.

Another aspect is directed to a method of monitoring faults in a memory that may include reading a plurality of memory locations at a first time, determining a first fault count and fault map signature including the transient and permanent faults at the first time based upon reading the plurality of memory locations, and storing the first fault count and fault map signature. The method may also include reading the plurality of memory locations at a second time, determining a second fault count and fault map signature including the transient and permanent faults at the second time based upon reading the plurality of memory locations, and comparing the stored first fault count and fault map signature with the second fault count and fault map signature to determine a permanent fault count. In addition, the method may include generating an indication based upon the permanent fault count exceeding a threshold, and the first and second fault counts and fault map signatures may be stored in triple replication over different blocks within the memory.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
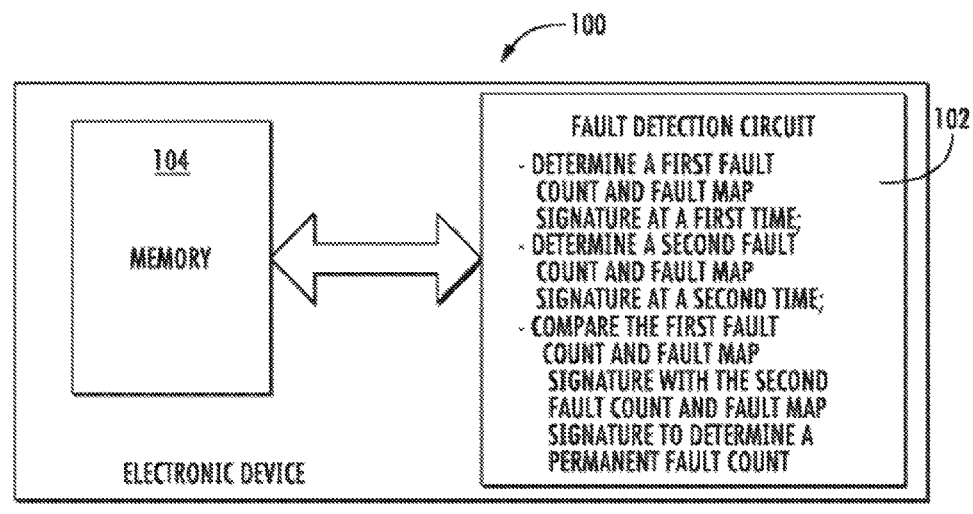
FIG. 1 is a block diagram of an electronic device in accordance with embodiments of the present invention.

Referring initially to FIG. 1, an electronic device 100 is illustrated having fault detection circuit 102 coupled to a memory 104. The memory 104 may have a plurality of memory locations being subject to transient faults and permanent faults. The fault detection circuit 102 may be configured to read the memory 104 at a first time (e.g., power-down) and determine a first fault count and fault map signature including the transient and permanent faults at the first time based upon reading the memory 104. The first fault count and fault map signature is stored. In a particular embodiment, the memory 104 may also be read at a second time (e.g., power-up) and a second fault count and fault map signature is determined including the transient and permanent faults at the second time based upon reading the plurality of memory locations. The fault detection circuit 102 may compare the stored first fault count and fault map signature corresponding to the power-down event with the second fault count and fault map signature corresponding to the power-up event to determine a permanent fault count.

The electronic device 100 is capable of managing and reading the memory 102 at startup (e.g., power-up) and before shut off (e.g., power-down), store the fault information in a retrievable location, perform an assessment of the stored fault information and the recent test, and read results to assess the extent of permanent and transient faults.

As explained above, the memory 104, for example flash or other non-volatile memory, is read and correctable errors may be detected during a test. The correctable errors may be single bit, double bit, or triple bit, for example. An address and syndrome corresponding to each type of correctable error may be used to compute a unique signature for the respective correctable error.

In addition, a number of each type of correctable error in the memory 104 is counted by the fault detection circuit 102. This count may be compared with the stored count result of the last power-up and power-down tests and the records may be updated accordingly with respect to permanent and transient faults of each type.

For example, a correctable error that is not detected at power-up that was detected at the last power-down is considered a transient fault, and a correctable error that is detected at both power-up and power-down is considered a permanent fault. The signature and the count of each type of correctable error is stored inside the memory 104 (e.g., data flash) and may be protected by triple replication spread over different memory blocks and the error correction schemes.

Figure 2:
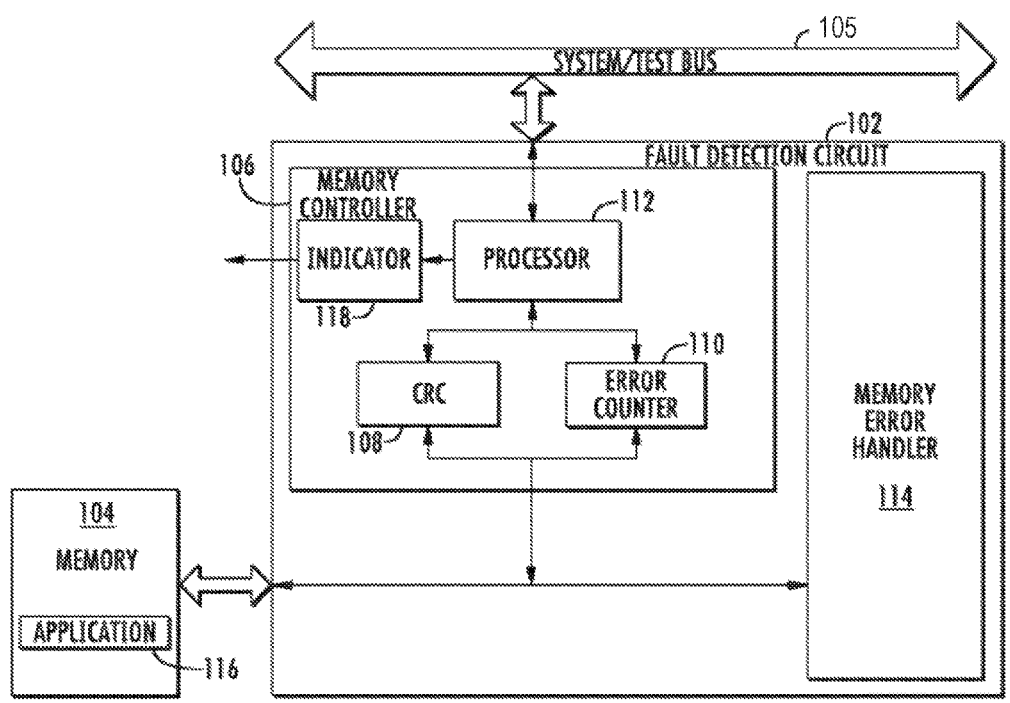
FIG. 2 is a more detailed block diagram of the electronic device of FIG. 1.

Referring now to FIG. 2, the fault detection circuit 102 may include a memory controller 106. The memory controller may be configured to read the plurality of memory locations of the memory 104. The memory controller 106 is coupled to a system/test bus 105. The memory controller 106 may also have a cyclic redundancy check (CRC) 108 that is configured to detect the transient and permanent faults as would be appreciated by those skilled in the art. The CRC 108 may also compute the signature for each transient and permanent fault using the address and syndrome of the respective correctable error.

An error counter 110 of the memory controller 106 may be used to determine the first and second counts of the transient and permanent faults. The memory controller 106 may include a processor 112 that may be programmed with software, or may be an application specific integrated circuit (ASIC). For example, the processor 112 of the memory controller 106 may be configured to compare the first fault count and fault map signature with the second fault count and fault map signature to determine the permanent fault count based upon a change between the first fault count and fault map signature that corresponds to the power-down event and the second fault count and fault map signature corresponding to the power-up event. Each transient fault may be defined as a single bit or double bit correctable error, for example, and each permanent fault may be defined as a triple bit uncorrectable error in a particular embodiment, for example. The correctable error bit count is scalable based on the error correction scheme.

A memory error handler 114 of the fault detection circuit 102 may be coupled to the memory 104 and configured to receive the permanent and transient faults. The memory error handler 114 may be configured to store (n) correctable and (m) uncorrectable errors. Although safety and high assurance systems may implement error correction schemes to handle errors during the lifetime of the electronic device 100, the extent of the faults in the memory 104 may now be indicated by the fault detection circuit 102 before the faults reach a critical point where an application 116 is disrupted abruptly.

For example, an error correction scheme may correct up to (x) bits as would be appreciated by those skilled in the art. The memory error handler 114 receives all error indications, namely, correctable and uncorrectable with corresponding address and syndrome. The memory error handler 114 may store a maximum of (n) correctable and (m) uncorrectable errors. Forwarding to the memory error handler 114, of correctable errors up to (x−1) bit corrections, can be masked by a register, implementing a protection scheme against random/transient faults inside the memory controller 106. For example, single bit errors may be masked as being non-critical.

After the start-up test of the memory 104, the signature computed by the CRC 108 and the count by the error counter 110 for each type of correctable error, is compared with the previously stored record to detect any change in number of each type of correctable error. An increase in the count for each type of correctable error may indicate that the application 116 may be closer to being disrupted abruptly. The fault detection circuit further comprises an indicator circuit or indicator 118 coupled to the processor 112 to generate an indication based upon the permanent fault count exceeding a threshold.

As explained above, during normal operation a correctable error mask (CE-MASK) may be active and block forwarding particular correctable errors (single bit) to the memory error handler 114. The CE-MASK can be deactivated for debug purpose to diagnose the failures.

Until the time that no (x) bit correctable errors are reported, corrections for (x−1) bit or lower are not accounted for by the fault detection circuit 102 (configurable). After the first (x) bit correction is reported, a test is performed, at every power-up, where all locations of memory 104 are read and signature of the errors is computed by the CRC 108 along with the count of each correctable error performed by the error counter 110. Transient (x−1) bit correctable errors are not reported to the memory controller 106 during runtime.

The signature and the count for each type of error are stored in triple replication in the memory 104, data flash for example, distributed over different flash blocks under hardware/software control.

The computed signature and count for each type of correctable error (single, double, triple . . . ), after each test, is compared with the previously stored counts (e.g., from the power-up or power-down) to detect any change in the number of each type of correctable error and the record is updated accordingly for transient and permanent type of faults. At power-down, the memory 104 is read again and the signature and the error count of each correctable error may be stored. Accordingly, no change in the correctable error count at the power-down event from the previous power-up event indicates no additional transient faults. If there is no change in the count of correctable errors at the next power-up event from the last power-down event, then no additional permanent faults were detected.

During normal operation, the single error correction mask (SEC-MASK) may be active and blocks forwarding SEC events to the memory error handler 114. The SEC-Mask can be deactivated for debug purposes to diagnose the failures.

Figure 3:
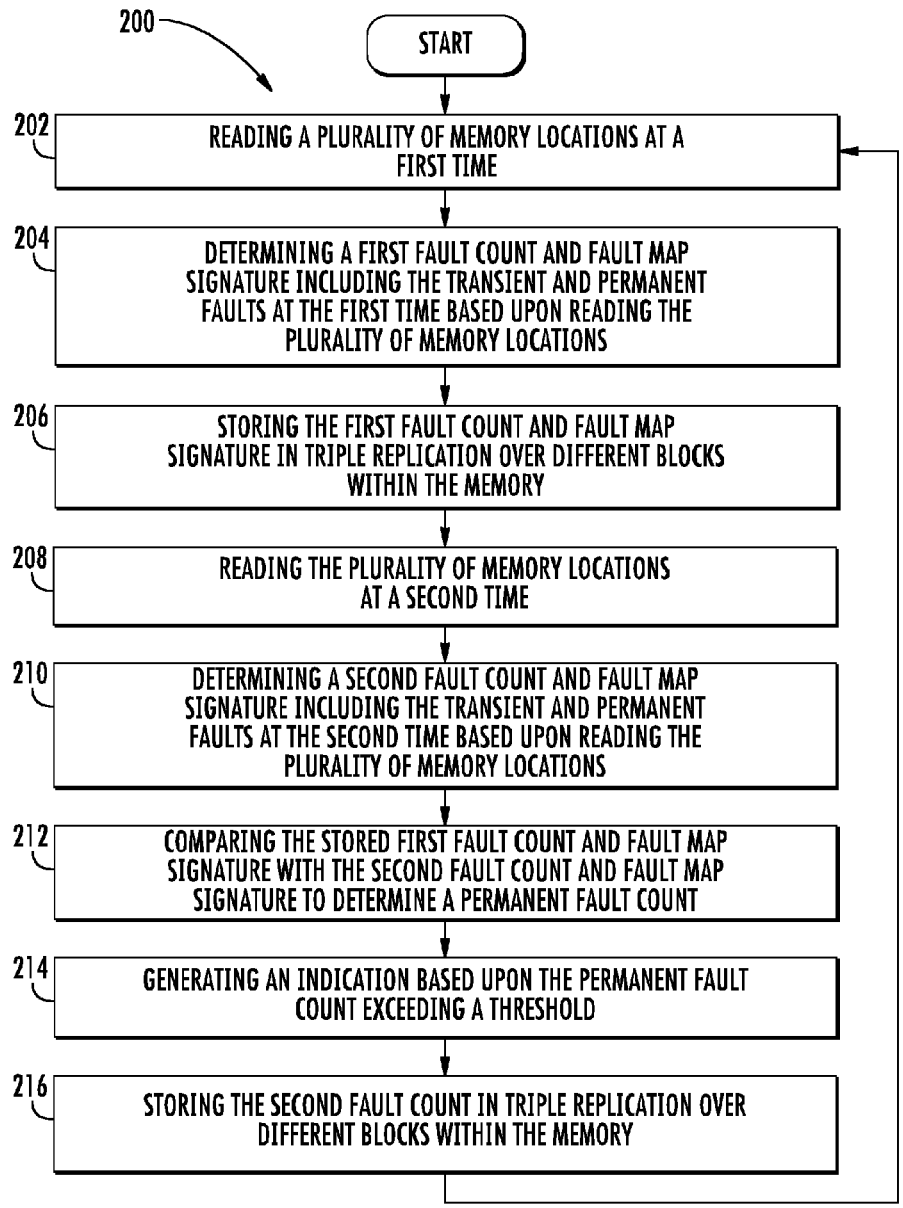
FIG. 3 is a flow diagram of a method of monitoring faults in accordance with embodiments of the present invention.

Referring now to FIG. 3, a flowchart of a method of monitoring faults in a memory is now described, and generally designated 200. The fault detection circuit 102 described above may implement the method 200. For example, at 202, a plurality of memory locations are read at a first time, and a first fault count is determined, at 204, including transient and permanent faults at the first time (e.g., corresponding to a power-down event) and based upon reading a plurality of memory locations. Moving to 206, the first fault count and fault map signature of the permanent and transient faults is stored in triple replication over different memory blocks within the memory.

The plurality of memory locations, at 208, are read at a second time and a second fault count and fault map signature is determined, at 210, including the transient and permanent faults at the second time (e.g., corresponding to a power-up event) based upon reading the plurality of memory locations. The stored first fault count and fault map signature (e.g., corresponding to the power-down) is compared with the second fault count and fault map signature (e.g., corresponding to a power-up event) to determine a permanent fault count, at 212. At 214, an indication is generated based upon the permanent fault count exceeding a threshold. The second fault count and fault map signature may be stored, at 216, in triple replication over different blocks in the memory. The method may continue to monitor the permanent and transient faults by reading the memory locations again, at 204, and repeating the process described above.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
    a memory having a plurality of memory locations being subject to transient faults and permanent faults; and
    a fault detection circuit coupled to the memory and configured to
        read the plurality of memory locations at a first time and determine a first fault count and fault map signature including the transient and permanent faults at the first time based upon reading the plurality of memory locations,
        store the first fault count and fault map signature,
        read the plurality of memory locations at a second time and determine a second fault count and fault map signature including the transient and permanent faults at the second time based upon reading the plurality of memory locations,
        compare the stored first fault count and fault map signature with the second fault count and fault map signature to determine a permanent fault count of the plurality of memory locations, and
        generate an indication based on the comparison, wherein the fault detection circuit comprises a memory controller configured to read the plurality of memory locations, a memory error handler coupled to the memory controller, and a processor configured to compare the stored first fault count and fault map signature with the second fault count and fault map signature to determine the permanent fault count based upon a change between the stored first fault count and fault map signature and the second fault count and fault count signature, wherein the memory controller comprises a cyclic redundancy check (CRC) circuit coupled to the processor and configured to detect the transient and permanent faults, and an error counter coupled to the CRC circuit and configured to determine the first and second fault counts of the transient and permanent faults.

2. The electronic device of claim 1, wherein said fault detection circuit further comprises an indicator configured to generate an indication based upon the permanent fault count exceeding a threshold.

3. The electronic device of claim 1, wherein the memory controller is configured to store the first fault count and fault map signature and the permanent fault count in triple replication over different blocks within the memory.

4. The electronic device of claim 1, wherein the CRC circuit is configured to compute a signature for each transient and permanent fault.

5. The electronic device of claim 1, wherein the first time comprises a power-down event of said memory.

6. The electronic device of claim 1, wherein the second time comprises a power-up event of the memory.

7. The electronic device of claim 1, wherein each transient and permanent fault has a memory address and a syndrome associated therewith.

8. The electronic device of claim 1, wherein each transient fault comprises a single bit or double bit correctable error, and each permanent fault comprises a triple bit uncorrectable error.

9. The electronic device of claim 1, wherein the memory comprises a non-volatile memory.

10. A fault detection device for a memory having a plurality of memory locations being subject to transient faults and permanent faults, the fault detection device comprising:
    a memory controller and a memory error handler cooperating therewith and configured to
        read the plurality of memory locations at a first time and determine a first fault count and fault map signature including said transient and permanent faults at the first time based upon reading the plurality of memory locations,
        store the first fault count and fault map signature,
        read the plurality of memory locations at a second time and determine a second fault count and fault map signature including the transient and permanent faults at the second time based upon reading the plurality of memory locations, and
        compare the stored first fault count and fault map signature with the second fault count and fault map signature to determine a permanent fault count of the plurality of memory locations, and
        generate an indication based on the comparison, wherein the memory controller comprises a cyclic redundancy check (CRC) circuit configured to detent the transient and permanent faults, and an error counter coupled to the CRC circuit and configured to determine the first and second fault counts of the transient and permanent faults; and a processor coupled to the CRC circuit and error counter to compare the stored first fault count and fault map signature with the second fault count and fault map signature to determine the permanent fault count based upon a change between the stored first fault count and fault map signature and the second fault count and fault map signature.

11. The fault detection device of claim 10, further comprising an indicator configured to generate an indication based upon said permanent fault count exceeding a threshold.

12. The fault detection device of claim 10, wherein the memory controller is configured to store the first fault count and fault map signature and the permanent fault count in triple replication over different blocks within the memory.

13. The fault detection device of claim 10, wherein the CRC circuit is configured to compute a fault map signature from each transient and permanent fault.

14. The fault detection device of claim 10, wherein the first time comprises a power-down event of the memory.

15. The fault detection device of claim 10, wherein the second time comprises a power-up event of the memory.

16. The fault detection device of claim 10, wherein each transient and permanent fault has a memory address and a syndrome associated therewith.

17. The fault detection device of claim 10, wherein each transient fault comprises a single bit or double bit correctable error, and each permanent fault comprises a triple bit uncorrectable error.

18. A method of fault detection for a memory having a plurality of memory locations being subject to transient faults and permanent faults, the method comprising:
   reading a plurality of memory locations at a first time using a memory controller;
   determining a first fault count and fault map signature including the transient and permanent faults at the first time based upon reading the plurality of memory locations by using a cyclic redundancy check (CRC) circuit to detect the transient and permanent faults and an error counter coupled to the CRC circuit to determine the first fault count of the transient and permanent faults;
   storing, using a memory error handler, the first fault count and fault map signature;
   reading, using the memory controller, the plurality of memory locations at a second time;
   determining a second fault count and fault map signature including the transient and permanent faults at the second time based upon reading the plurality of memory locations by using the CRC circuit to detect the transient and permanent faults and an error counter to determine the second fault count of the transient and permanent faults;
   comparing, using the memory controller, the stored first fault count and fault map signature with the second fault count and fault map signature using a processor coupled to the CRC circuit and error counter to determine a permanent fault count of the plurality of memory locations based upon a change between the stored first fault count and fault map signature and the second fault count and fault map signature; and
   generating an indication based on the comparison using an indicator circuit.

19. The method of claim 18, further comprising generating the indication based upon the permanent fault count exceeding a threshold.

20. The method of claim 18, wherein the first and second fault counts and fault map signatures are stored in triple replication over different blocks within the memory.

* * * * *

UNITED STATES PATENT AND TRADEMARK OFFICE
CERTIFICATE OF CORRECTION

PATENT NO. : 9,990,245 B2
APPLICATION NO. : 14/951639
DATED : June 5, 2018
INVENTOR(S) : Om Ranjan et al.

Page 1 of 1

It is certified that error appears in the above-identified patent and that said Letters Patent is hereby corrected as shown below:

In the Claims

In Column 6, Line 15, Claim 2, delete "said" and insert --the--.

In Column 6, Line 16-17, Claim 2, delete "an indicator configured to generate an indication" and insert --an indicator circuit configured to generate the indication--.

In Column 6, Line 48, Claim 10, delete "said" and insert --the--.

In Column 6, Line 63, Claim 10, delete "detent" and insert --detect--.

In Column 7, Line 9, Claim 11, delete "an indicator configured to generate an indication" and insert --an indicator circuit configured to generate the indication--.

Signed and Sealed this
Seventh Day of August, 2018

Andrei Iancu
*Director of the United States Patent and Trademark Office*